United States Patent
Tan

(10) Patent No.: US 7,157,306 B2
(45) Date of Patent: Jan. 2, 2007

(54) METHOD OF AND SYSTEM FOR MANUFACTURING ORGANIC EL DEVICES

(75) Inventor: Hiroki Tan, Yamagata-ken (JP)

(73) Assignee: Tohoku Pioneer Corporation, Yamagata (JP)

( * ) Notice: Subject to any disclaimer, the term of this patent is extended or adjusted under 35 U.S.C. 154(b) by 0 days.

(21) Appl. No.: 11/100,503

(22) Filed: Apr. 7, 2005

(65) Prior Publication Data
US 2005/0227385 A1 Oct. 13, 2005

(30) Foreign Application Priority Data
Apr. 8, 2004 (JP) .............................. 2004-114387
Aug. 25, 2004 (JP) .............................. 2004-244848

(51) Int. Cl.
*H01L 51/40* (2006.01)

(52) U.S. Cl. .................................. 438/99; 257/E51.022

(58) Field of Classification Search .................. 438/69, 438/82, 99, 149; 257/E51.022; 315/169.3; 345/76
See application file for complete search history.

(56) References Cited

U.S. PATENT DOCUMENTS

2004/0046494 A1* 3/2004 Lai .............................. 313/504
2004/0227460 A1* 11/2004 Liao et al. .................... 313/506
2005/0073228 A1* 4/2005 Tyan et al. ................... 313/110
2005/0099113 A1* 5/2005 Yamada ....................... 313/504

FOREIGN PATENT DOCUMENTS

| JP | 2000-294372 | 10/2000 |
| JP | 2001-291585 | 10/2001 |

* cited by examiner

*Primary Examiner*—Brook Kebede
(74) *Attorney, Agent, or Firm*—Arent Fox PLLC

(57) ABSTRACT

It is an object of the present invention to eliminate a color deviation possibly caused by a film formation failure in an organic layer of organic EL devices, thereby improving product yield. A method of manufacturing organic EL devices according to the invention comprises: a pre-treating step for forming lower electrodes and the like on a substrate, a film formation step to be performed after the pre-treating step for forming on the lower electrodes an organic layer containing at least an organic luminescent layer and also forming upper electrodes thereon, and a sealing step to be performed after the film formation step for sealing up the organic layer and the upper electrodes, characterized in that an inspection step is performed after the pre-treating step but before the formation of the upper electrodes.

19 Claims, 13 Drawing Sheets

METHOD OF AND SYSTEM FOR MANUFACTURING ORGANIC EL DEVICES

BACKGROUND OF THE INVENTION

The present invention relates to a method of and a system for manufacturing organic EL (Electroluminescence) devices.

The present application claims priority from Japanese Application Nos. 2004-114387 and 2004-244848, the disclosures of which are incorporated herein by reference.

An organic EL device has a basic structure formed by laminating on a substrate a lower electrode, an organic layer containing an organic luminescent layer, and an upper electrode. By applying a voltage between the upper electrode and the lower electrode, electrons will be injected into the organic layer from cathode side formed on one of the upper electrode and the lower electrode, while positive holes will be injected into the organic layer from anode side formed on the other of the upper electrode and the lower electrode. In this way, the electrons and positive holes are recombined with each other within the organic luminescent layer of the organic layer, thereby effecting a light emission.

A method of manufacturing a plurality of the above-descried organic EL devices includes a pre-treating step, a film formation step, and a sealing step. Generally, in the pre-treating step, film formation and patterning are performed on a substrate to form thereon lower electrodes and lead electrodes, followed by forming an insulating layer and performing another patterning on the lower electrodes to divide the same to form a plurality of openings in luminescent areas. In the film formation step, film formation is carried out in the openings of the luminescent areas, so that an organic layer containing an organic luminescent layer (for example, a hole transporting layer, a luminescent layer, an electron transporting layer), as well as upper electrodes, are formed successfully on the lower electrodes, thereby forming a plurality of organic EL devices on the substrate. In the sealing step, a sealing cover or a sealing film is used to seal up the formed organic EL devices so as to protect the organic EL devices from outside air.

In the organic EL device manufacturing method described above, an inspection step is performed to find out inferior products in which organic EL devices do not show a good luminescence characteristic due to poor film formation. Usually, such an inspection step is performed only after the sealing step so as to prevent the formed organic EL devices from being exposed to the outside air during the inspection step. For example, Japanese Unexamined Patent Application Publication No. 2001-291585 has suggested providing an inspection room which is maintained at vacuum or kept in a dried atmosphere, performing an inspection step for examining the luminescence characteristic of organic EL devices after forming upper electrodes (after film formation step), without performing a subsequent sealing step for finding out inferior products.

The inspection step applies a voltage between the lower and upper electrodes so as to investigate a luminescence characteristic. However, with regard to organic EL devices required to provide specific luminescent colors in order to perform color display, the inspection step also checks whether there is a color deviation. Such a color deviation is caused due to a reflection interference of lights which are multiply reflected between the upper and lower electrodes together holding an organic layer therebetween and then emitted outwardly, also due to a fact that the peak wavelength of an emitted light is deviated from that of a desired luminescence color. This has proved to be a trouble which happens when the thickness of the organic layer has not reached a predetermined thickness, regardless of whether a display panel containing the organic EL devices is a bottom emission type or a top emission type.

In order to deal with the color deviation mentioned above, Japanese Unexamined Patent Application Publication No. 2000-294372 has disclosed using a film thickness sensor based on a quartz oscillator, or measuring a fluorescence intensity obtained when irradiating evaporated molecules with ultraviolet rays at the time of vapor deposition, thereby effecting a film formation which can ensure a desired film thickness.

According to the conventional method disclosed by Japanese Unexamined Patent Application Publication No. 2001-291585, since an inspection step is performed after the formation of upper electrodes and since organic EL devices having poor luminescence and color deviation are judged to be inferior, such inferior organic EL devices can be removed prior to a sealing step, thus making it possible to dispense with other subsequent steps. In this way, it is possible to reduce a process loss and improve production efficiency. However, since the inspection step is performed after the formation of upper electrodes, it is impossible to correct a color deviation even if the color deviation is caused due to a film thickness which is deviated from a predetermined film thickness. As a result, those judged to be inferior in an inspection step have to be thrown away. Accordingly, a yield of product will be affected by the precision of film formation in a film formation step, and an increased poor film formation can thus bring about a low yield. Besides, there is also a problem that if a high precision of film formation is realized, productivity will decrease.

Moreover, as shown in Japanese Unexamined Patent Application Publication No. 2000-294372, although the film formation step performs the film formation while at the same time measuring film thickness, not any measuring method is capable of directly measuring the thickness of the organic layer laminated on the lower electrodes, but can only indirectly measure such thickness. As a result, an irregularity is likely to occur in the thickness of an actually formed organic layer due to various conditions, proving itself to be a cause which is responsible for color deviations.

SUMMARY OF THE INVENTION

The present invention is to solve the afore-mentioned problem as one of its tasks. Namely, it is an object of the present invention to provide a method of and a system for manufacturing organic EL devices, including forming on a substrate lower electrodes, an organic layer having an organic luminescent layer, and upper electrodes, making it possible to improve a product yield by reducing the occurrence of inferior products caused due to poor film formation, thus producing organic EL devices free from color deviation by highly precisely forming an organic layer having a predetermined thickness.

In order to achieve the above objects, a method of and a system for manufacturing organic EL devices according to the present invention are characterized by at least the following aspects.

According to one aspect of the present invention, there is provided a method of manufacturing organic EL devices, comprising: a pre-treating step for forming at least lower electrodes on a substrate; a film formation step for forming an organic layer containing at least an organic luminescent layer and upper electrodes on the lower electrodes subsequent to the pre-treating step; a sealing step for sealing up the organic layer and the upper electrodes subsequent to the film formation step. In particular, an inspection step is carried out subsequent to the pre-treating step but prior to the formation of the upper electrodes.

According to another aspect of the present invention, there is provided a system of manufacturing organic EL devices, including at least one film formation apparatus which, after a pre-treating step for forming at least lower electrodes on a substrate, forms an organic layer containing at least an organic luminescent layer and upper electrodes on the lower electrodes. The at least one film formation apparatus comprises: film formation rooms each including move-in means for moving the substrate treated in the pre-treating step into a film formation step and film formation means for forming an organic layer on the substrate; and an inspection room including transporting means for transporting the substrate among the film formation rooms and film thickness measuring means for measuring the thickness of films formed on the substrate in the film formation rooms.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
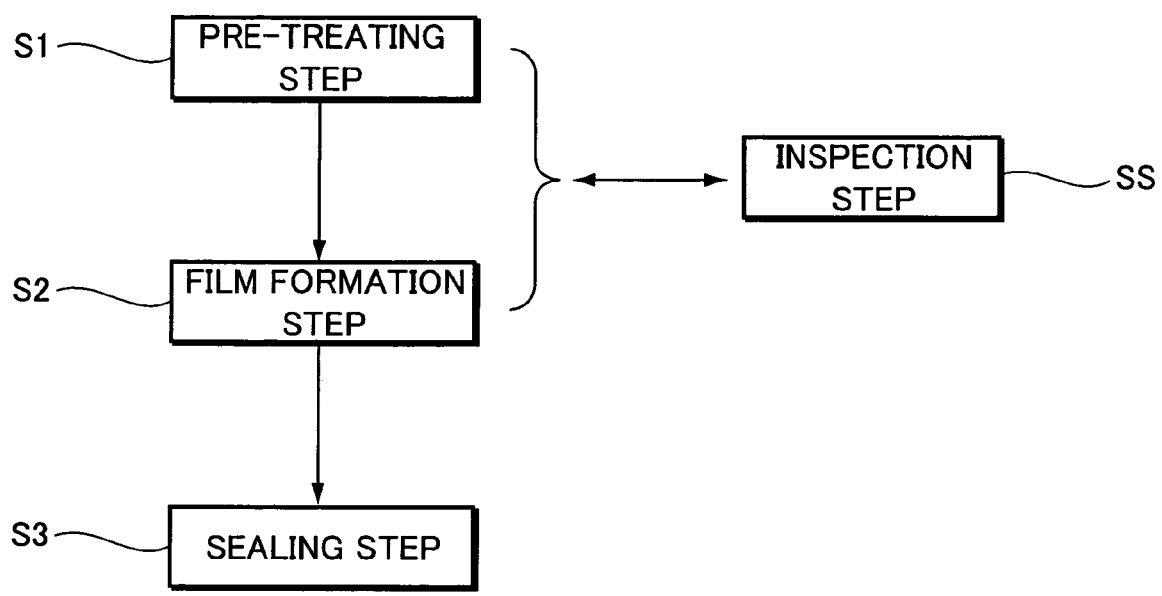
FIG. 1 is an explanatory chart showing a method of manufacturing organic EL devices according to one embodiment of the present invention.

In the following, embodiments of the present invention will be described in detail with reference to the accompanying drawings. FIG. 1 is an explanatory chart briefly showing a method of manufacturing organic EL devices according to one embodiment of the present invention. As shown, the method of the present invention includes a pre-treating step S1 of forming lower electrodes or the like on a substrate, a film formation step S2 of forming on the lower electrodes an organic layer containing an organic luminescent layer as well as upper electrodes, and a sealing step S3 of sealing up the organic layer and the upper electrodes subsequent to the film formation step S2. The method also includes an inspection step which is carried out after the pre-treating step S1 but prior to the formation of the upper electrodes in the film formation step S2.

In this way, by performing the inspection step SS after the pre-treating step S1 prior to the formation of the upper electrodes in the film formation step S2, if an inspection result shows that there is a film formation failure, such a failure can be repaired so as to ensure an appropriate film thickness. Further, if it is required to perform a multiple layer film formation, the inspection step SS can make it easy to judge which layer of film formation involves a film formation failure during the whole film formation step, thus rendering it possible to reflect this fact in the next film formation so as to prevent similar failure from occurring in the next and subsequent film formations.

The inspection step SS shown in FIG. 1 is carried out by measuring the thicknesses of the lower electrodes and the organic layer. For example, the inspection step SS can be performed by using an optical film thickness measuring method. However, when measuring the thickness of the lower electrodes, the present embodiment of the present invention should not be limited to a case in which only the thickness of the lower electrodes is measured. In fact, this embodiment of the invention is also applicable to a case in which a total thickness including the substrate and base layer such as a flattening film under the lower electrodes is measured. Further, even when measuring the thickness of the organic layer, the present embodiment of the present invention should not be limited to a case in which only the thickness of the formed organic layer is measured, but is also applicable to a case in which the thickness including the lower electrodes and a base layer all under the organic layer is measured.

In this way, since the thickness including the lower electrodes and the organic layer thus laminated is actually measured, subsequent film formations can be set in accordance with the actually measured thickness, thereby making it possible to form an appropriate organic layer with a high precision. Further, using the optical film thickness measurement method for measuring film thickness makes it possible to measure an optical characteristic such as index of refraction at the same time, thus making it possible to set the film thickness of subsequent film formations by taking into account an optical characteristic. Here, as an optical film thickness measurement method, it is possible to employ an optical interference type thickness gage, a spectrum ellipsometer, a light absorption method or the like. Moreover, since film thickness is actually measured during film formation step, it is possible to form an organic layer having a predetermined thickness with a high precision even if the film formation itself is not performed with a high precision.

Figure 2:
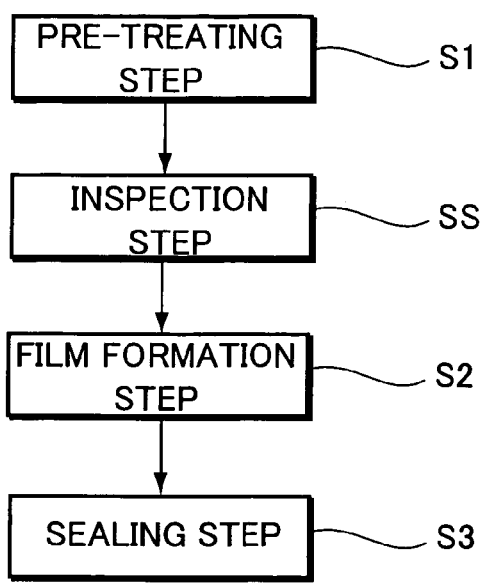
FIG. 2 is an explanatory chart showing a method of manufacturing organic EL devices according to one embodiment of the present invention.
Figure 2:
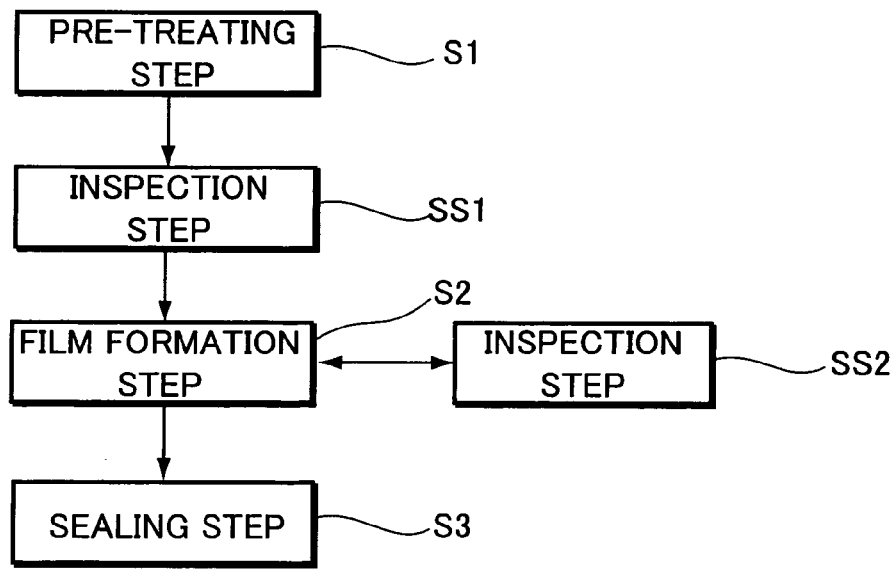
Figure 2:
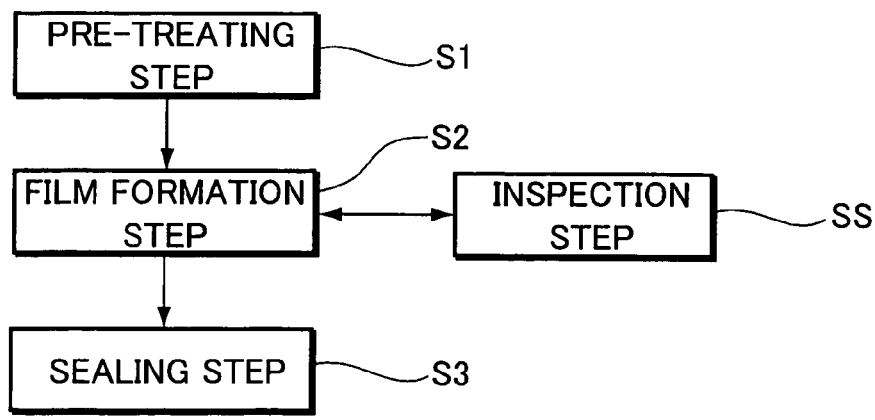
Figure 3:
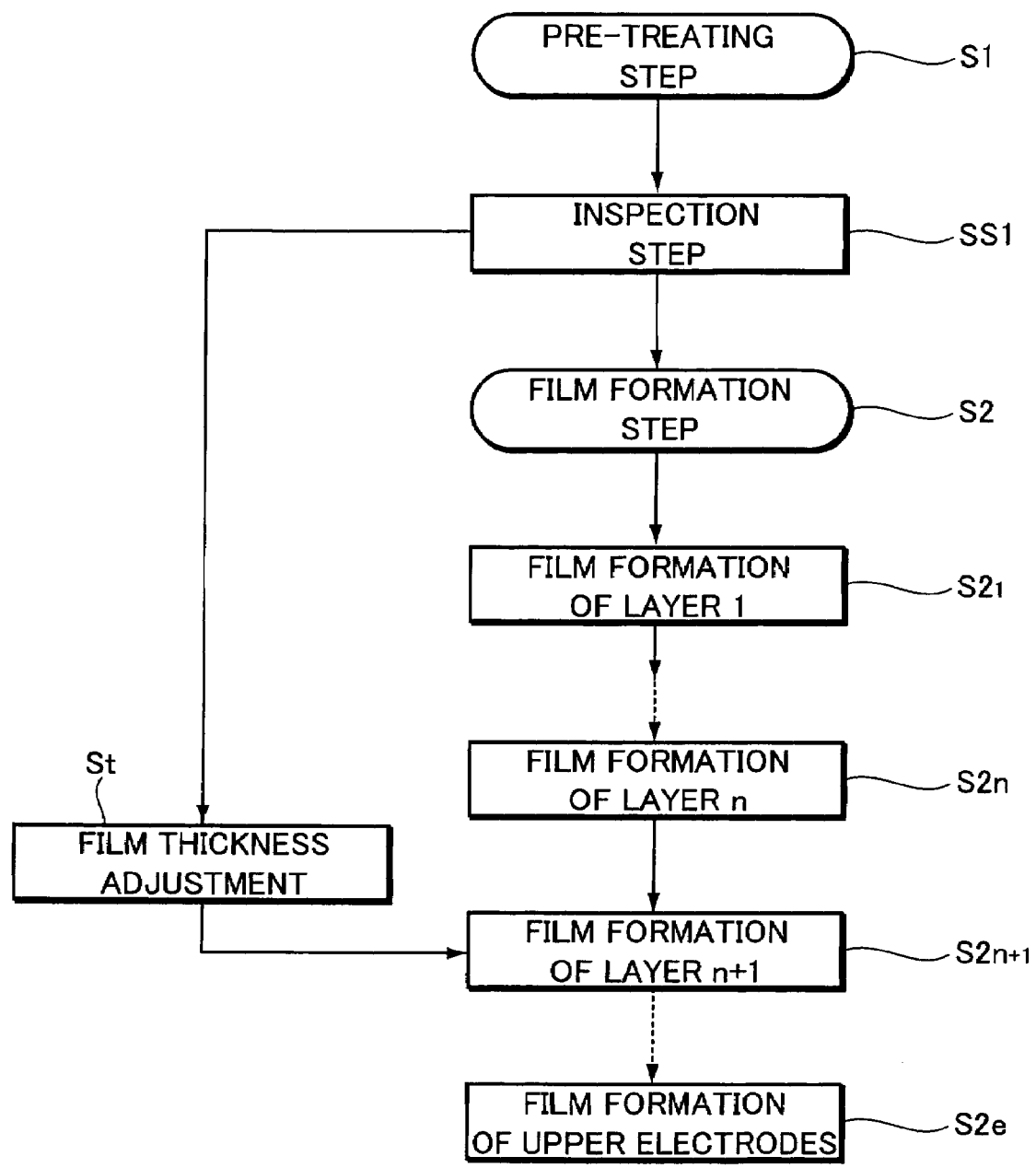
FIG. 3 is an explanatory chart showing a method of manufacturing organic EL devices according to one embodiment of the present invention.
Figure 4:
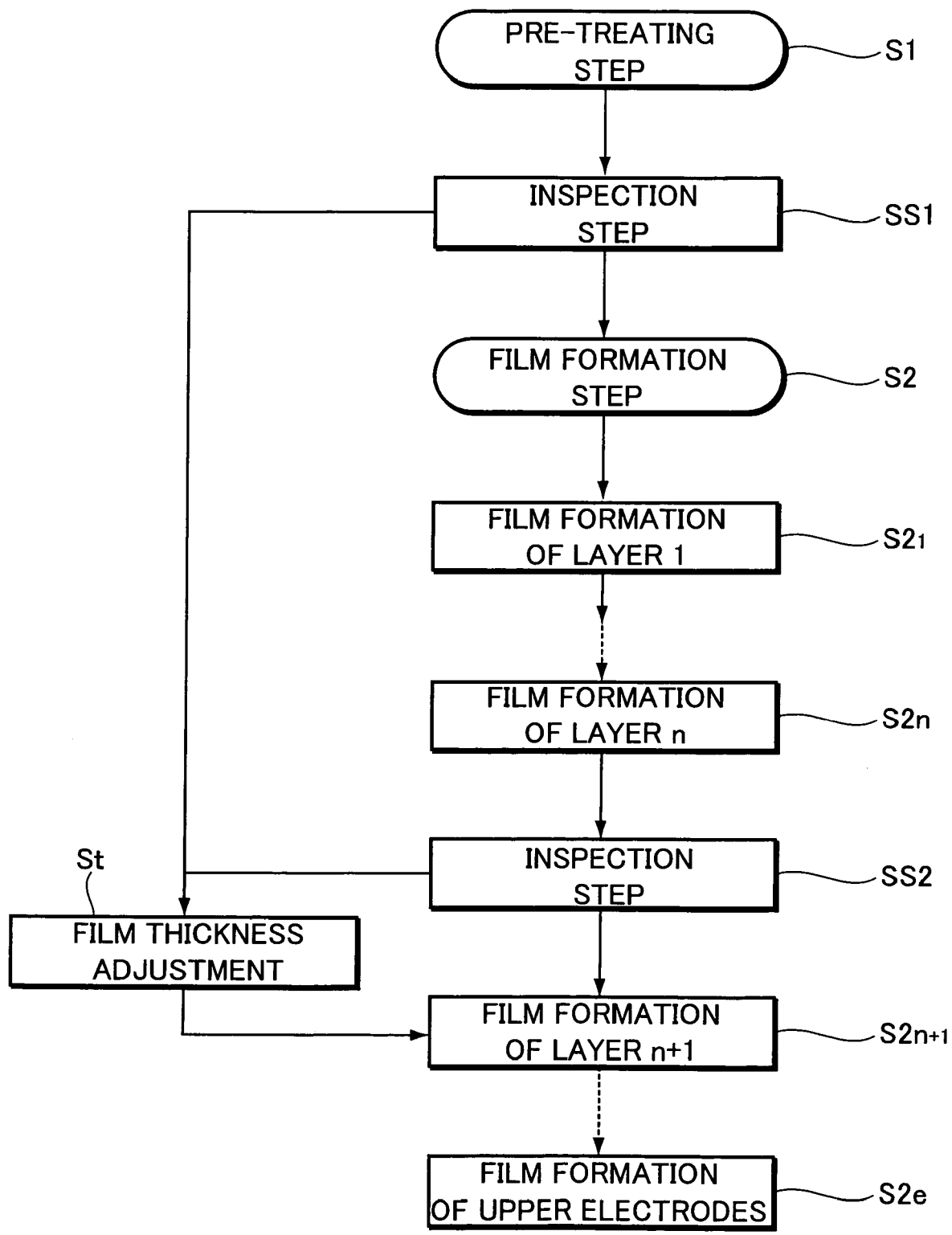
FIG. 4 is an explanatory chart showing a method of manufacturing organic EL devices according to one embodiment of the present invention.
Figure 5:
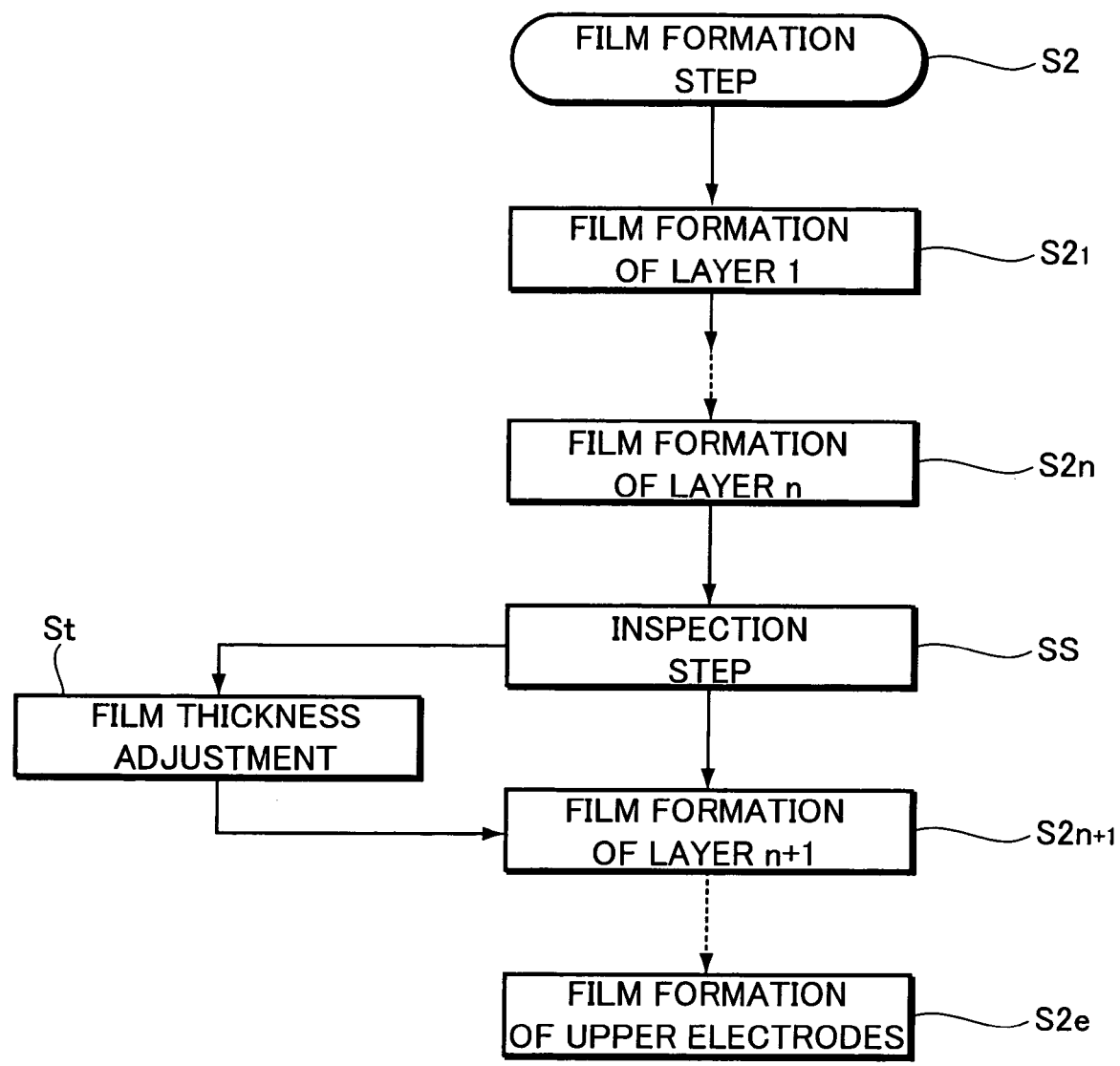
FIG. 5 is an explanatory chart showing a method of manufacturing organic EL devices according to one embodiment of the present invention.

FIGS. 2A–2C are explanatory charts classifying the embodiment of FIG. 1 into different types in accordance with a period during which an inspection step SS is carried out. FIG. 2A represents an example in which an inspection step SS is performed after a pre-treating step S1 but before a film formation step S2. FIG. 2B represents an example in which an inspection step SS is performed after a pre-treating step S1 and once again during the film formation step S2 (i.e., two inspection steps SS1 and SS2 are performed). FIG. 2C represents an example in which an inspection step SS is performed during the film formation step S2. Moreover, FIGS. 3–5 are also explanatory charts showing in more detail the respective film formation steps S2 listed in FIGS. 2A–2C. Hereafter, related descriptions will be made successively as follows.

FIG. 2A shows that the inspection step SS for examining the thickness of the lower electrodes formed in the pre-treating step S1 is carried out prior to the film formation step S2. Here, although the film to be examined mainly means the lower electrodes, it is also possible to measure a total film thickness including not only the lower electrodes but also a base layer such as a flattening film, an insulating film, and a protective film if these films are possibly involved. Furthermore, if thin films are adopted informing an ITO substrate for a bottom emission type display panel, it is further possible to measure a total film thickness including the lower electrodes, the base layer as well as the ITO substrate. Here, so-called base layer means a film formed between the substrate and the lower electrodes. In more detail, such base layer means a flattening film covering irregularities on a functional element such as a thin film transistor (TFT), a color conversion filter and a color filter, or means an insulating film or a protective film formed on the flattening film for shutting off a gas (such as a water vapor) discharged from the flattening film. Further, an insulating film not only means an insulating layer serving as a base layer formed on the flattening film, but also means an insulating layer for use in dividing to form a plurality of organic devices. Hereafter, so-called base layer means layers having the same essential elements as described above. However, in the present invention these base layers are not absolutely necessary.

FIG. 3 is an explanatory chart showing in more detail the steps of FIG. 2A. As shown, the thickness of the lower electrodes is measured in the inspection step SS performed subsequent to the pre-treating step S1. After forming at least one first organic layer in the film formation step S2, it is possible to adjust the thickness of other organic layers laminated on the first organic layer in accordance with the result of the inspection step SS. Namely, as shown in FIG. 3, after film formation ($S2_1$) of layer 1 . . . film formation ($S2_n$) of layer n have been performed during the film formation step S2, an adjustment is carried out to adjust the thickness of layer n+1 subsequently formed in accordance with the measurement result of the film thickness of the lower electrodes, based on the result of the inspection step SS. Then, upper electrodes are formed ($S2_e$) on the layer n+1 on which the film thickness adjustment $S_t$ has been performed (if necessary, it is also possible to form other layers). Here, the film thickness adjustment $S_t$ is performed by simulating a light emission characteristic from the result of an optical film thickness measurement method to predict a color deviation. In this way, it is possible to prevent the color deviation by making the layer n+1 formed in the film formation step subsequent to the inspection step into a color correction layer.

Moreover, as shown in FIG. 2A and FIG. 3, by performing the inspection step SS for measuring the thickness of the lower electrodes prior to the film formation step S2, performing a simulant calculation on these data, and optimally calculating the thickness of a positive hole transporting layer, a luminescent layer and an electron transporting layer, it is possible to perform a correction in the form of feed forward at the time of vapor deposition for forming various layers.

Next, as shown in FIG. 2B, the inspection step SS1 for measuring the thickness of the lower electrodes formed in the pre-treating step S1 is performed prior to the film formation step S2. Then, during the film formation step S2 an inspection step SS2 is carried out. Here, although films to be examined in the inspection step SS1 are mainly lower electrodes as shown in FIG. 2A and FIG. 3, it is also possible to measure a total thickness including not only the lower electrodes but also a flattening film or the like serving as a base layer. In particular, where thin film has been adopted in the substrate, it is possible to measure a total thickness including the substrate, the base layer, and the lower electrodes.

Further, the inspection step SS2 to be performed in the film formation step S2 is carried out after the formation of at least one first organic layer, and it is possible to adjust the thickness of other organic layers laminated on the first organic layer in accordance with the results of the inspection step SS1 and the inspection step SS2 which are all performed subsequent to the pre-treating step S1.

Namely, as shown in FIG. 4, the inspection step SS1 is performed after the pre-treating step S1 but before the film formation step S2, thereby measuring the thickness of the lower electrodes. Then, film formation ($S2_1$) of layer 1 . . . film formation ($S2_n$) of layer n are performed during the film formation step S2, followed by performing the inspection step SS2, thereby measuring the thickness of organic layers laminated up to layer n. Subsequently, an adjustment $S_t$ is carried out to adjust the thickness of subsequently formed layer n+1 in accordance with the measurement results of the inspection steps SS1 and SS2. Then, upper electrodes are formed ($S2_e$) on the layer n+1 on which the film thickness adjustment $S_t$ has been performed (if necessary, it is also possible to form other layers). Here, the film thickness adjustment $S_t$ is performed by simulating a light emission characteristic from the result of an optical film thickness measurement method to predict a color deviation.

In this way, it is possible to calculate, as an optimal film thickness having less error, the thickness of layer n+1 serving as a color correction layer based on film thickness adjustment $S_t$, in accordance with the results of two inspection steps SS1 and SS2 shown in FIG. 2B and FIG. 4. Namely, the film thickness of the lower electrodes and the like formed in the pre-treating step S1 can be correctly detected in the inspection step SS1, while the film thickness of the organic layer formed in the film formation step S2 can be correctly detected in the inspection step SS2, so that it is possible to calculate the film thickness of layer n+1 which serves as the color correction layer based on film thickness adjustment $S_t$. In fact, such film thickness serves as an optimal value having the least error with respect to a predetermined film thickness. As a result, since the film thickness of layer n+1 can inhibit the color deviation and can itself serve as an optimal film thickness, it is possible to prevent such color deviation.

Next, FIG. 2C shows that the inspection step SS is carried out during a film formation step S2 for forming an organic layer containing an organic luminescent layer after the pre-treating step S1. At this time, as shown in FIG. 5, the inspection step SS is performed after forming at least one first organic layer, and it is possible to adjust the thickness of other organic layers formed on the first organic layer, in accordance with the result of the inspection step SS. Namely, as shown in FIG. 5, film formation ($S2_1$) of layer 1 . . . film formation ($S2_n$) of layer n are performed during the film formation step S2, followed by performing the inspection step SS, thereby measuring the thickness of organic layers laminated up to layer n. Subsequently, an adjustment $S_t$ is carried out to adjust the thickness of subsequently formed layer n+1 in accordance with the result of the film thickness measurement. Then, upper electrodes are formed ($S2_e$) on the layer n+1 on which the film thickness adjustment $S_t$ has been performed (if necessary, it is also possible to form other layers). Here, the film thickness adjustment $S_t$ is performed by simulating a light emission characteristic from the result of an optical film thickness measurement method to predict a color deviation. In this way, it is possible to prevent such color deviation by making the layer n+1 formed after the inspection step into a color correction layer.

Therefore, if an inspection step SS is carried out during a film formation step S2 which forms an organic layer containing an organic luminescent layer (as shown in FIG. 2C and FIG. 5), it is possible to prevent a color deviation by making a subsequently formed layer n+1 into a color correction layer.

As shown in FIGS. 2A to 2C and FIGS. 3 to 5 explaining in detail FIGS. 2A to 2C, the inspection steps SS, SS1, and SS2 are performed after the pre-treating step S1 but before the formation of upper electrodes in the film formation steps S2, while an organic layer subsequently formed is made into a color correction layer so as to eliminate a color deviation.

In addition, the inspection steps shown in FIGS. 2B, 2C and FIGS. 4, 5 can also be used to adjust the thickness of the first organic layer in accordance with the respective inspection results. Namely, the thickness of the formed first organic layer may be measured and used as a color correction layer, followed by forming another first organic layer on the first organic layer, thereby forming a color correction layer for performing color adjustment. However, concrete examples of these steps will be described in detail with reference to FIGS. 7 to 10.

Figure 6:
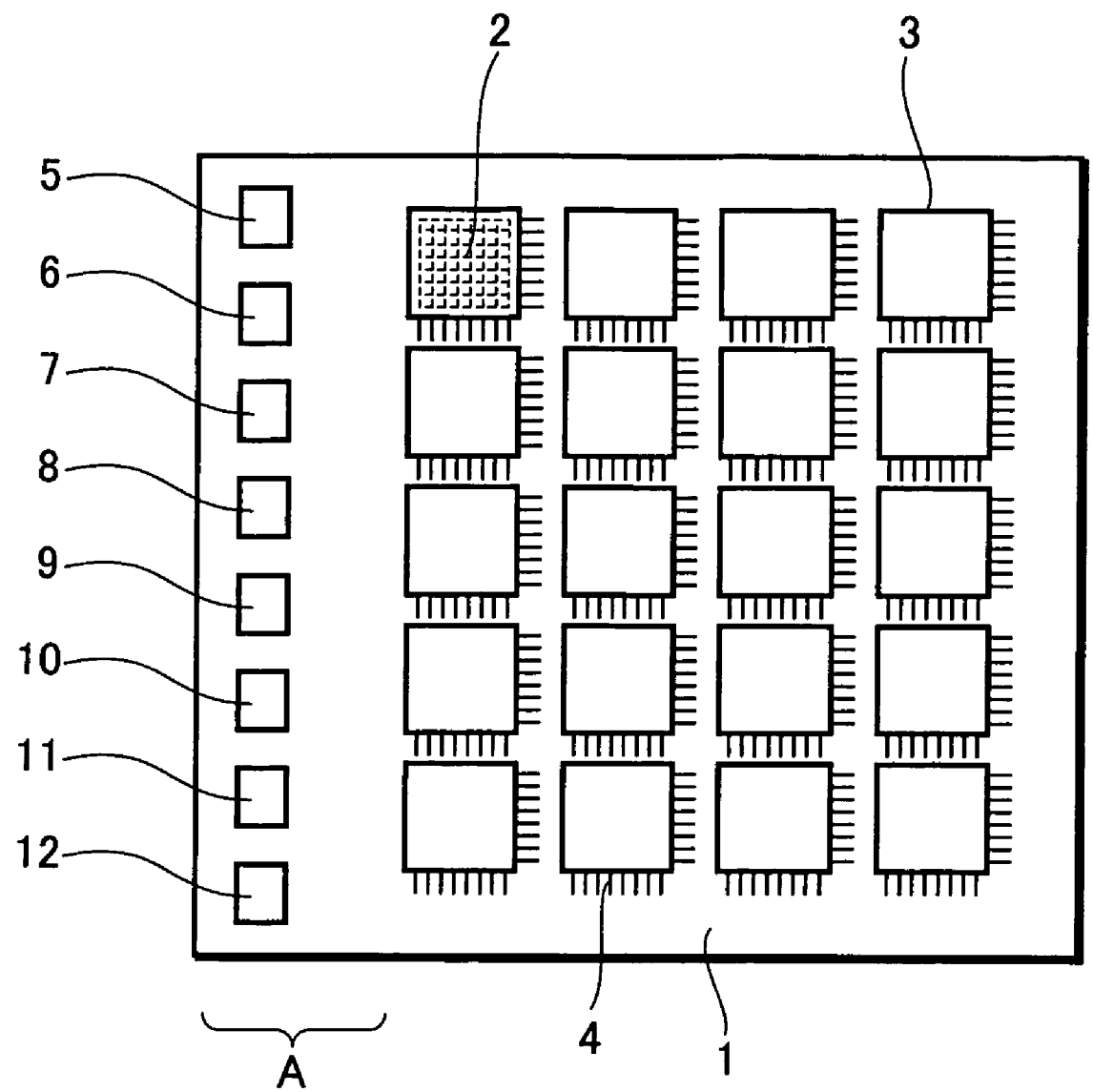
FIG. 6 is an explanatory view showing a method of manufacturing organic EL devices according to one embodiment of the present invention.

FIG. 6 can be used to explain an example of a method for measuring the thicknesses of films formed in the steps shown in FIGS. 1 to 5. Usually, as a method of measuring the respective thicknesses of the lower electrodes, base layer, and luminescent layer, there is a method of directly measuring the thickness of the lower electrodes laminated on a substrate, and there is another method which forms, in a position different from a predetermined film formation position (for example, making use of an open space on a mother glass substrate), a single film layer consisting of the same material, followed by directly measuring the thickness thereof.

For example, as shown in FIG. 6, a plurality of organic EL panels 3 having a great number of organic EL devices 2 are arranged on a multiple-chamfered mother glass substrate 1. These organic EL panels 3 have leading wire sections 4 in adjoining areas. Further, the mother glass substrate 1 has, in one portion of its plane (for example, an edge portion of the mother glass substrate 1), a single film area A for measuring the thickness of various layers. Independently formed in the single film area A are a lower electrode single film 5, a base layer flattening single film 6, an insulating layer single film 7, a positive hole injection-layer single film 8, a luminescent layer (R) single film 9, a luminescent layer (G) single film 10, aluminescent layer (B) single film 11, and an electron transporting layer single film 12, with the thickness of each single film being measured directly, thereby making it possible to correctly obtain the thickness of each respective layers laminated when forming the organic EL panels 3. However, in the embodiment of the present invention, the respective single films formed in the single film area A should not be limited to the number of the aforementioned single films. For example, the number of single films is allowed to be either less or more than the number of single films mentioned above (for example, containing a positive hole transporting layer single film and the like).

Still more detailed embodiments of the present invention will be described in the following. Embodiments shown in FIGS. 7 to 9 (corresponding to FIGS. 2A to 2C and FIGS. 3 to 5) show that three organic layers including a positive hole transporting layer, a luminescent layer and an electron transporting layer 3 are formed by virtue of vapor deposition.

Figure 7:
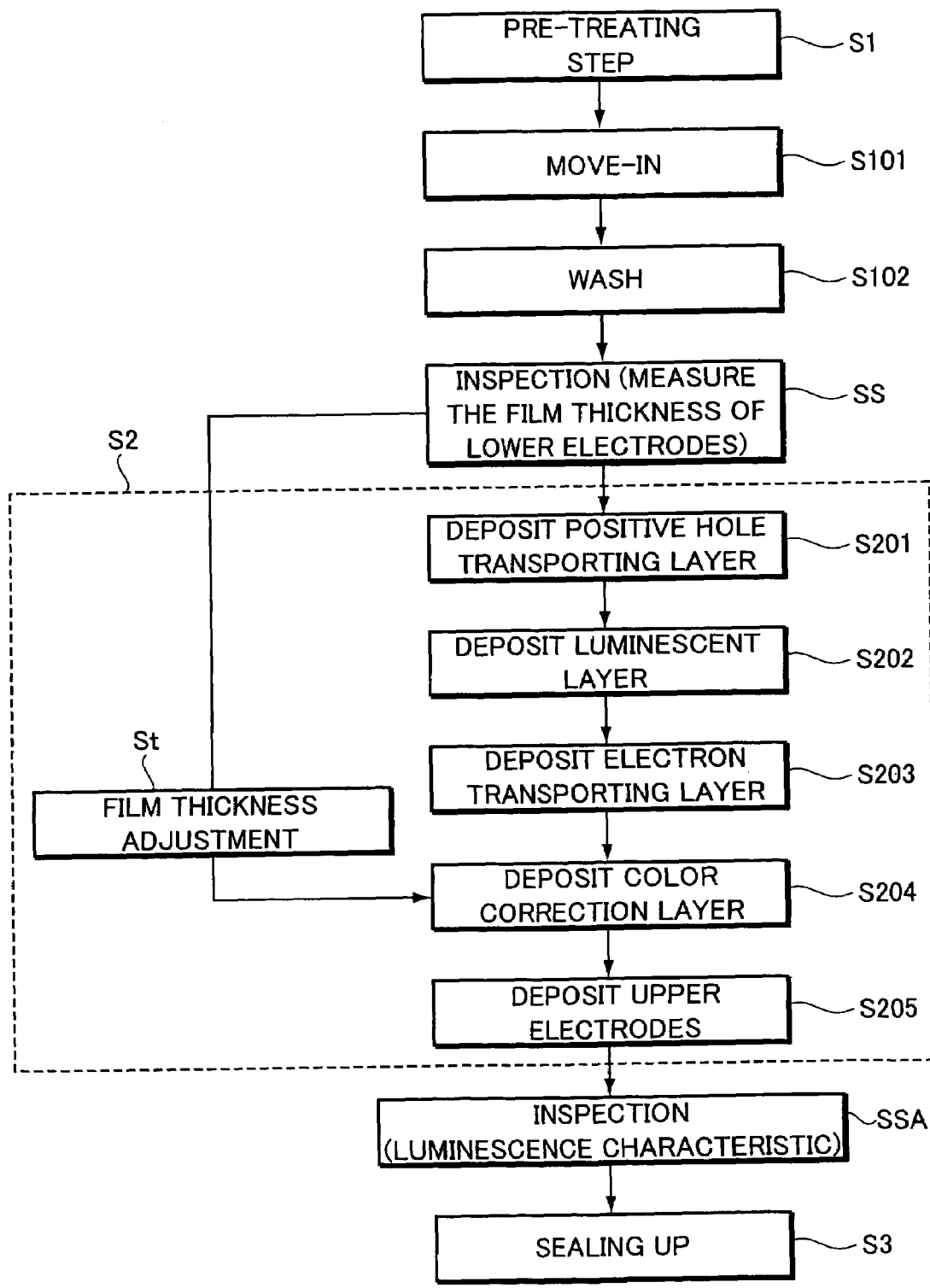
FIG. 7 is an explanatory chart showing a method of manufacturing organic EL devices according to one embodiment of the present invention.

In an embodiment shown in FIG. 7, an inspection step SS is performed on the lower electrodes formed on a substrate by virtue of a pre-treating step S1 in the same manner as shown in FIG. 2A and FIG. 3.

In detail, after the pre-treating step S1, substrate is moved into a predetermined apparatus (S101) and washed there (S102), followed by performing an inspection step SS based on optical film thickness measurement, thereby measuring the thickness of the lower electrodes. Subsequently, a film formation step S2 is performed to deposit a positive hole transporting layer on the lower electrodes (S201), followed by depositing a luminescent layer (S202) as well as an electron transporting layer (S203) thereon.

In the inspection step SS, a spectrum ellipsometer is employed to measure the laminated thickness of the lower electrodes and the like. Once the laminated film thickness is measured in this state, a luminescence characteristic is simulantly calculated in accordance with the optical characteristics of the respective layers calculated at the time of measurement as well as film thickness measurement results, followed by adjusting the thickness of a color correction layer formed thereafter, in a manner such that the peak wavelength of an emitted light, which depends on the thickness of an organic layer, will be coincident with a predetermined color. Then, a color correction layer consisting of an electron transporting layer is vapor deposited (S204) on the electron transporting layer in accordance with the thickness set by the above adjustment.

Subsequently, upper electrodes are vapor deposited (S205), followed by an inspection (SSA) based on an actual measurement of luminescence characteristic similar to a conventional measurement, so that confirmation may be performed to ensure that there is no color deviation. Finally, organic EL devices are sealed up in a sealing step (S3).

Figure 8:
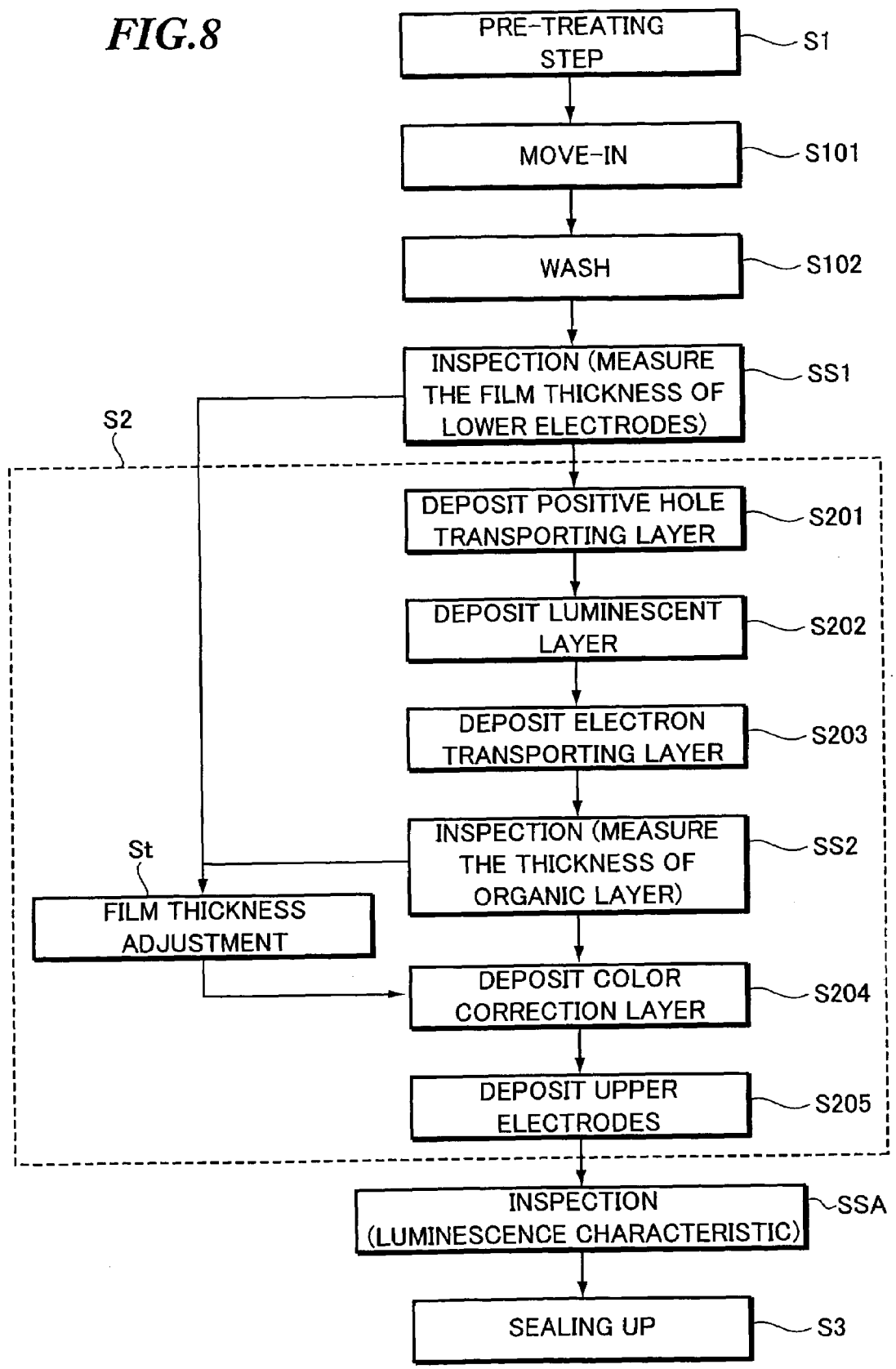
FIG. 8 is an explanatory chart showing a method of manufacturing organic EL devices according to one embodiment of the present invention.

In an embodiment shown in FIG. 8, similar to the steps shown in FIG. 2B and FIG. 4, after performing a pre-treating step S1, an inspection step SS1 based on an optical film thickness measurement is carried out to measure the thickness of the lower electrodes and the like-formed on the substrate. Then, prior to the formation of upper electrodes in a film formation step S2, an inspection step SS2 is carried out to measure the thickness of an organic layer formed. In more detail, after the pre-treating step S1, substrate is moved into a predetermined apparatus (S101) and washed there (S102), followed by performing an inspection step SS1 to measure the thickness of the lower electrodes by virtue of a spectrum ellipsometer. Subsequently, a film formation step S2 is performed to deposit a positive hole transporting layer on the lower electrodes (S201), followed by depositing a luminescent layer (S202), as well as an electron transporting layer (S203) thereon. At this time, an inspection based on the optical film thickness measurement is performed (inspection step SS2). Similar to the inspection step SS1, the inspection step SS2 uses a spectrum ellipsometer or the like to measure a laminated thickness of the positive hole transporting layer, the luminescent layer, and the electron transporting layer formed on the lower electrodes.

Once the thicknesses of the laminated lower electrodes and organic layer are measured in the two inspection steps SS1 and SS2, a luminescence characteristic is simulantly calculated in accordance with the optical characteristics of the respective layers calculated at the time of measurement as well as film thickness measurement results, followed by adjusting the thickness of a color correction layer formed thereafter, in a manner such that the peak wavelength of an emitted light, which depends on the thickness of an organic layer, will be coincident with a predetermined color. Then, a color correction layer consisting of an electron transporting layer is vapor deposited (S204) on the electron transporting layer (formed before the inspection step SS2) in accordance with the thickness set by the above adjustment.

Subsequently, upper electrodes are vapor deposited (S205), followed by an inspection (SSA) based on an actual measurement of luminescence characteristic similar to a conventional measurement, so that confirmation may be performed to ensure that there is no color deviation. Finally, organic EL devices are sealed up in a sealing step (S3).

Figure 9:
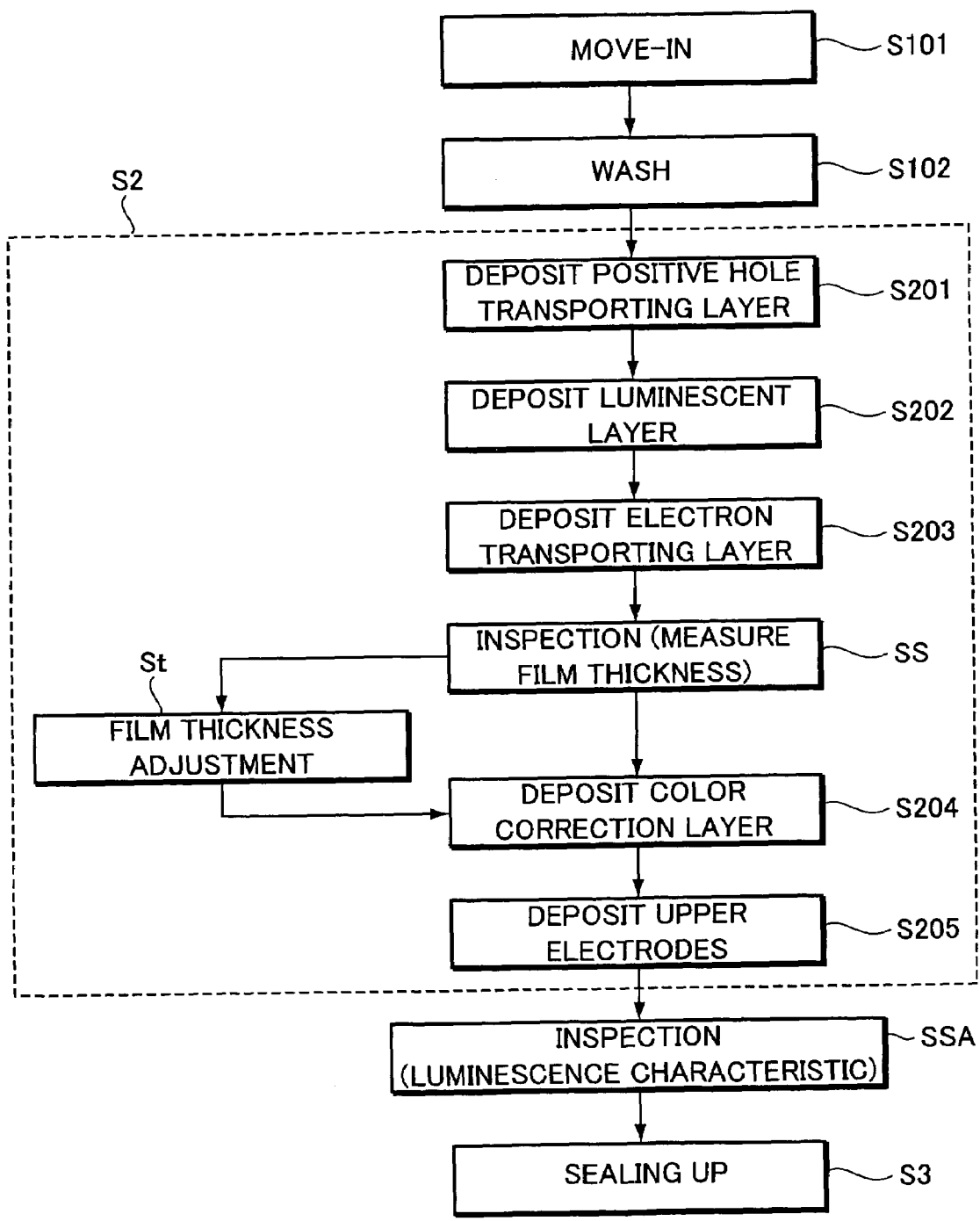
FIG. 9 is an explanatory chart showing a method of manufacturing organic EL devices according to one embodiment of the present invention.

In an embodiment shown in FIG. 9, similar to the steps shown in FIG. 2C and FIG. 5, a pre-treating step is performed at first. Then, a substrate on which lower electrodes have been formed is moved into a predetermined apparatus (S101) and washed there (S102), followed by performing a film formation step S2. Actually, the film formation step S2 is performed to deposit a positive hole transporting layer on the lower electrodes (S201), followed by depositing a luminescent layer (S202), as well as an electron transporting layer (S203) thereon. At this time, an inspection based on the optical film thickness measurement is performed (inspection step SS2). In fact, the inspection step SS2 uses a spectrum ellipsometer to measure a laminated thickness of the positive hole transporting layer, the luminescent layer, and the electron transporting layer formed on the lower electrodes.

Once the thicknesses of the laminated layers are measured in the inspection step SS, a luminescence characteristic is simulantly calculated in accordance with the optical characteristics of the respective layers calculated at the time of measurement as well as film thickness measurement results, followed by adjusting the thickness of a color correction layer formed thereafter, in a manner such that the peak wavelength of an emitted light, which depends on the thickness of an organic layer, will be coincident with a predetermined color. Then, a color correction layer consisting of an electron transporting layer is vapor deposited (S204) on the electron transporting layer (formed before the inspection step SS) in accordance with the thickness set by the above adjustment.

Subsequently, upper electrodes are vapor deposited (S205), followed by an inspection (SSA) based on an actual measurement of luminescence characteristic similar to a conventional measurement, so that confirmation may be performed to ensure that there is no color deviation. Finally, organic EL devices are sealed up in a sealing step (S3).

However, in the film formation steps S2 shown in FIGS. 7 to 9, the thicknesses of various organic layers or electron transporting layer to be formed are set in a manner such that it is possible to obtain a desired thickness of organic layers including a color correction layer formed after the inspection step (namely, film thicknesses to be obtained at the time of film formation are set in a manner such that the laminated thickness to be measured in the respective inspection steps is thinner than the desired thickness of the organic layer).

According to the embodiments shown in FIGS. 7 to 9, instead of producing a color deviation caused by a film formation failure at the end of film formation step, the inspection steps SS1 and SS2 for actually measuring film thickness are inserted after the pre-treating step or in the middle of film formation to perform a thickness adjustment based on a color correction layer, thereby making it possible to prevent a film formation failure. Here, although the inspection steps SS1 and SS2 are inserted after the formation of electron transporting layer, the present invention should not be limited by this, and it is also possible to insert an inspection step SS at an earlier stage (for example, at the end of film formation of luminescent layer), and to make a layer formed after the insertion into a color correction layer.

Figure 10:
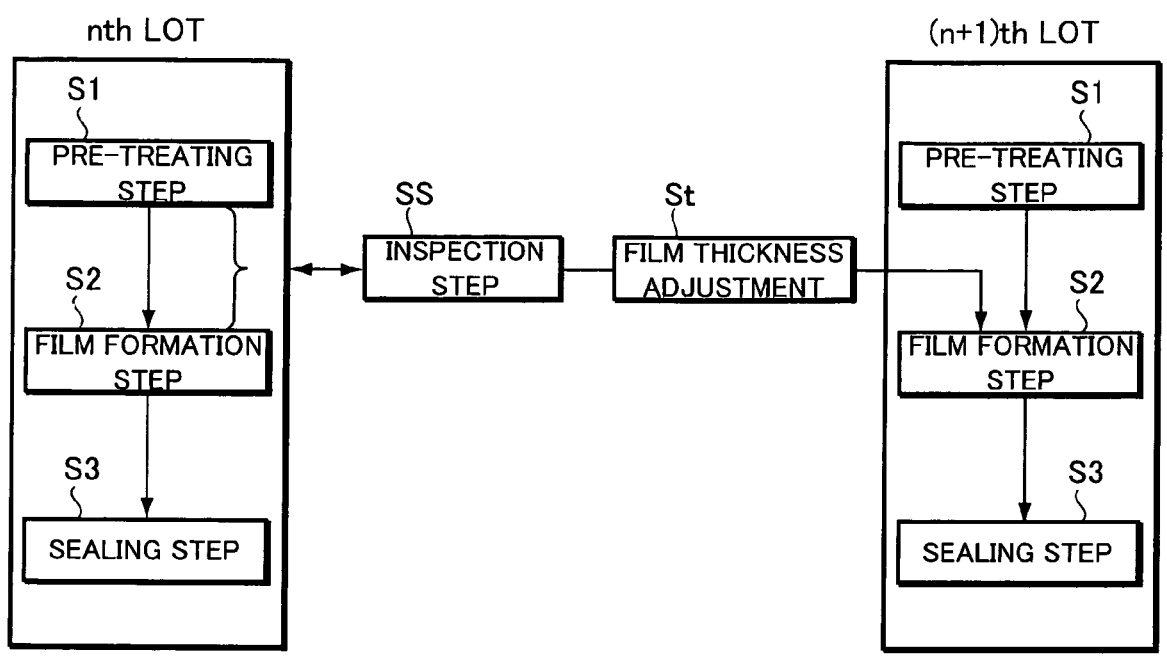
FIG. 10 is an explanatory chart showing a method of manufacturing organic EL devices according to one embodiment of the present invention.

Next, as shown in FIG. 10, another embodiment of the present invention performs, at a specific lot (nth lot), an inspection step SS after a pre-treating step S1 but before the formation of upper electrodes in a film formation step S2, and carries out, in accordance with the result of the inspection step SS, a film thickness adjustment at the time of film formation of layer n during a film formation step S2 at a next lot ((n+1)th lot). In more detail, since it is possible to detect a film formation failure at certain lot and make use of the detection result in setting a film thickness for film formation at a next lot, it is possible to prevent a similar film formation failure in the film formation of the same layer.

By virtue of the above-mentioned thickness adjustment St, it is possible to perform a color adjustment on the luminescence color of organic EL devices. Namely, the thickness adjustment St is performed to adjust the thickness of a finally formed organic layer to ensure a peak wavelength which is suitable for the luminescence color of organic EL devices, thereby making it possible to obtain acceptable organic EL devices free from any color deviation.

Namely, according to the present embodiment of the present invention, if the respective inspection steps SS, SS1 and SS2 are performed after a pre-treating step S1 but before the formation of upper electrodes in a film formation step S2, it is possible to perform the following correction on a film formation lot (hereinafter, referred to as Nth lot) and a next lot (hereinafter, referred to as (N+1)th lot), thereby adjusting a color deviation.

1) Film formation step at (N+1)th lot is adjusted (feedback) in an identical vapor deposition room.

For example, when measuring the thickness of a luminescent layer at Nth lot, if the film thickness of a positive hole injection layer is thick or thin, such thickness of the positive hole injection layer can be adjusted even at the lots from (N+b 1)th lot onwards, thereby performing a film formation ensuring an appropriate film thickness.

2) Film formations step at (N+1)th lot is adjusted (feed forward) in a different vapor deposition room.

For example, when measuring the thickness of a luminescent layer at (N+1)th lot, if the film thickness of lower electrodes is thick or thin, the lots from Nth lot onwards are moved into a pre-deposition room to properly form a color correction layer (for example, an electron transporting layer) having an predetermined film thickness. This adjustment proves to be effective in preventing a film formation failure prior to a film formation step S2 which forms lower electrodes, a base layer, an insulating layer and the like.

3) Film formation step at (N+1)th lot is adjusted (feed back) in a different vapor deposition room.

For example, when measuring the thickness of a luminescent layer at Nth lot, if the film thickness of a positive hole injection layer is thick or thin, film formation is performed to form positive hole transporting layers and luminescent layers having appropriate film thicknesses at lots from (N+1)th lot onwards.

4) The film formation step at Nth lot is adjusted.

For example, when measuring the thickness of a luminescent layer at Nth lot, if the film thickness of a positive hole injection layer is thin, Nth lot is fed back and moved again into a positive hole injection layer deposition room, thereby realizing a film formation capable of producing an appropriate film thickness. Alternatively, Nth lot is fed forward and moved into a pre-deposition room to form a color correction layer.

In the following, with reference to FIG. 11, description will be given to explain an example of carrying out the respective inspection steps SS, SS1, and SS2 for feeding inspection result back to next lot. In fact, FIG. 11 shows an example of performing an inspection step SS1 after a pre-treating step S1 and carrying out an inspection step SS2 during a film formation step S2 (as shown in FIG. 2B and FIG. 4).

Figure 11:
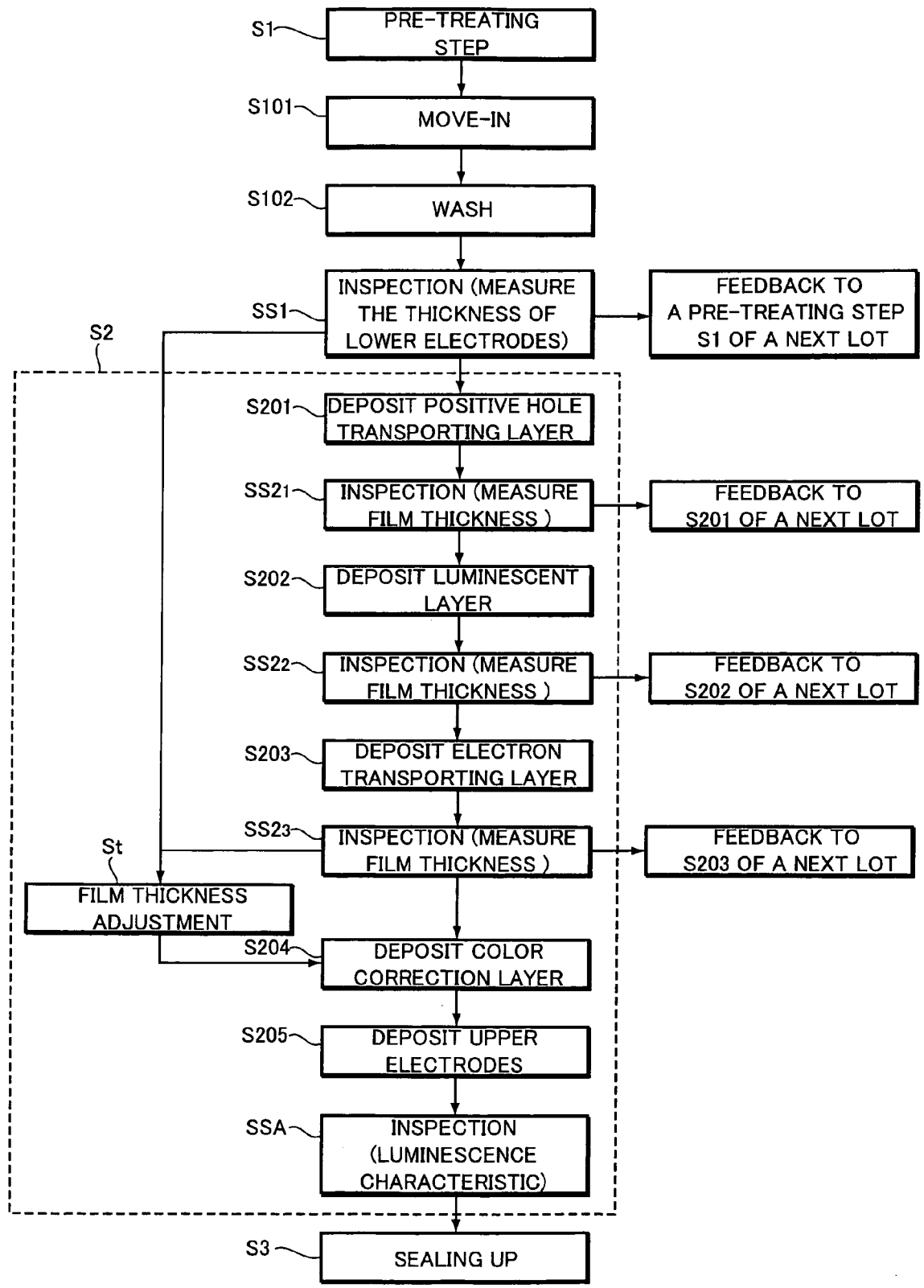
FIG. 11 is an explanatory chart showing a method of manufacturing organic EL devices according to one embodiment of the present invention.

FIG. 11 shows that the inspection steps SS1 and SS2 are performed after the pre-treating step S1 and also after the film formation of various layers. According to this embodiment, for example, an inspection step SS1 for measuring the thickness of lower electrodes is performed after the pre-treating step S1, thereby allowing the process to be fed back to the pre-treating step S1 performed at a next lot for forming lower electrodes, and comparing an actual film thickness with a predetermined film thickness of the lower electrodes. Moreover, for example, in an inspection step $SS2_1$ performed after the deposition of a positive hole transporting layer (S201), the film thickness of a positive hole transporting layer is actually measured and then compared with a preset film thickness which is to be obtained during the vapor deposition. If a laminated film thickness actually measured is different from a preset film thickness and such a difference is larger than an allowable range, such difference is fed back to the setting of the film formation of lower electrodes, as well as to the setting of the vapor deposition of a positive hole transporting layer. Here, although this example shows that inspection steps $SS2_1$ to $SS2_3$ are performed for each organic layer, the present invention should not be so limited. In fact, it is also possible to select specific layers which are likely to produce irregularities in film formation and perform the inspection steps $SS1$, $SS2_1$ to $SS2_3$ to deal with these layers.

The present embodiment, together with the function of the above-described embodiments, makes it possible for subsequent lots to return to desired thickness, thereby making it possible to prevent a situation in which similar film formation failure occurs in several mutually continuous lots.

As a manufacturing system for realizing the manufacturing method according to the above-described embodiments, the present invention provides an organic EL device manufacturing system equipped with film formation apparatus which, after a pre-treating step for forming at least lower electrodes on a substrate, forms an organic layer containing at least an organic luminescent layer and upper electrodes on the lower electrodes. The film formation apparatus comprises: film formation rooms having move-in means for moving the substrate treated in the pre-treating step into a film formation step and film formation means for forming the organic layer on the substrate; inspection rooms having transporting means for transporting the substrate among the film formation rooms and film thickness measuring means for measuring the thickness of layers formed on the substrate in the film formation rooms. Specifically, at least one of the film formation rooms and at least one of the inspection rooms are connected with each other through data transmission means for transmitting film thickness measurement results obtained in the inspection rooms.

Figure 12:
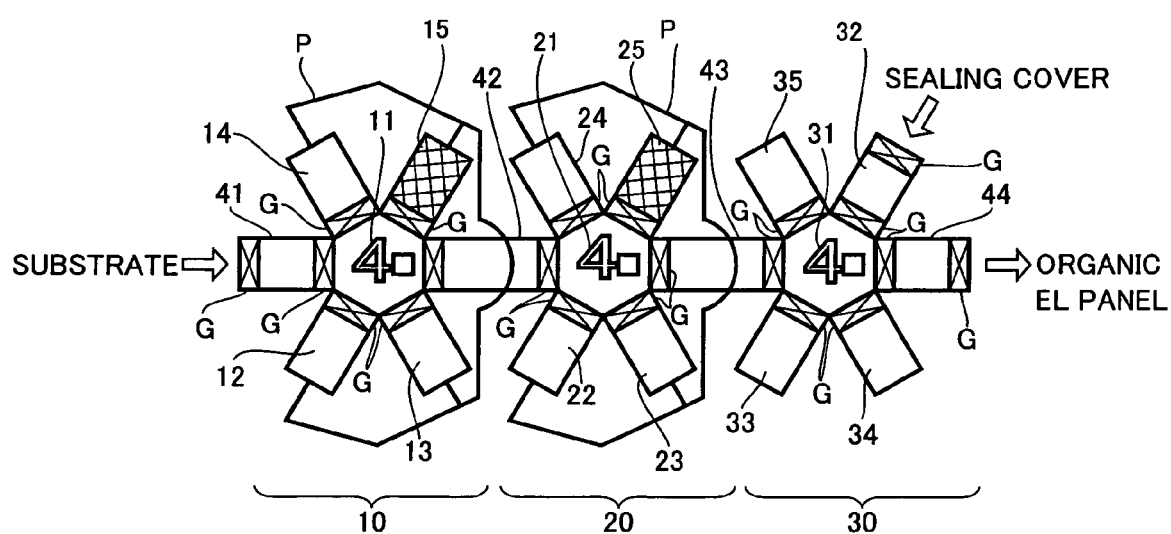
FIG. 12 is an explanatory view showing a system of manufacturing organic EL devices according to one embodiment of the present invention.

FIG. 12 shows an example of a manufacturing system of a cluster type (sheet leaf type) which can carry out an organic EL device manufacturing method according to the present invention. The manufacturing system comprises two mutually connected film formation apparatuses 10, 20 and a sealing apparatus 30. The film formation apparatus 10 is provided with a substrate conveyance room 41 on its inlet side, while delivery rooms 42, 43 are provided between the film formation apparatuses 10, 20 and the sealing apparatus 30. Further, a discharge room 44 is provided on the discharge side of the sealing apparatus 30. Moreover, the film formation apparatuses 10, 20 are provided in their centers with vacuum conveyance robots 11, 21 surrounded by a plurality of vapor deposition rooms 12, 13, 14, 22, 23, and 24. In addition, the film formation apparatuses 10, 20 are also provided with inspection rooms 15, 25 (for film thickness measurement).

Besides, the sealing apparatus 30 is also provided with a vacuum conveyance robot 31 in its center which is surrounded by a sealing cover conveyance room 32, an inspection room (for measuring luminescence characteristic) 33, a sealing room 34 and a preliminary vacuum chamber 35. In addition, a vacuum gate G is provided at each entrance of the vapor deposition rooms 12, 13, 14, 22, 23, and 24, as well as in each inlet/outlet of the delivery rooms 42 and 43, the substrate conveyance room 32, and the discharge room 44.

Here, in the film formation apparatuses 10 and 20, the vapor deposition rooms 12, 13, 14, 22, 23, and 24 are provided for forming organic layers (a positive hole transporting layer, luminescent layers (R, G, B), an electron transporting layer) and upper electrodes, and are equipped with resistance heating type vacuum evaporation apparatuses including evaporation sources for heating and thus evaporating deposition materials for forming various layers. Further, the inspection rooms 15, 25 are equipped with optical thickness measurement devices for measuring laminated film thicknesses. Then, the inspection room 15 and the respective vapor deposition rooms 12 to 14 or the inspection room 25 and the respective vapor deposition rooms 22 to 24 are connected with each other by data transmission means (including transmission line and transmission/reception device) P, in a manner such that the film thicknesses to be obtained in these vapor deposition rooms are adjustable in accordance with the detection results obtained in the inspection rooms 15, 25.

According to the above-descried manufacturing system, a substrate (ITO substrate) treated in a pre-treating step and washed thereafter is moved into the substrate conveyance room 41 so as to be moved to a vacuum conveyance robot 11 of the film formation apparatus 10. By virtue of the action of the vacuum conveyance robot 11, vapor depositions are successively carried out in the vapor deposition rooms 12, 13, and 14, while the thickness of laminated layers is measured in the inspection room 15. At this time, the delivery room 42 operates to deliver the substrate from the vacuum conveyance robot 11 of the film formation apparatus 10 to the vacuum conveyance robot 21 of the film formation apparatus 20. Then, in the film formation apparatus 20, by virtue of the action of the vacuum conveyance robot 21, vapor depositions are successively carried out in the vapor deposition rooms 22, 23, and 24, while the thickness of laminated layers is measured in the inspection room 25.

An example of a film formation step using the above manufacturing system will be described in detail below. For example, film formation of a first color is performed in the film formation apparatus 10. Then, a positive hole transporting layer functional for various colors is vapor deposited in the vapor deposition room 12, aluminescent layer (B) is vapor deposited in the vapor deposition room 13, and an electron transporting layer (B) is vapor deposited in the vapor deposition room 14. Afterwards, the film formation of a color correction layer is adjusted by simulating a luminescence characteristic based on a measurement result (a measurement result obtained in the inspection room 15 is transmitted to the vapor deposition room 14, while a film thickness is set in the vapor deposition room 14). Subsequently, the substrate is again moved into the vapor deposition room 14 or other vapor deposition room (not shown), thereby forming a color correction layer consisting of an electron transporting layer in accordance with an adjusted film thickness.

Afterwards, the substrate is moved to and received by the film formation apparatus 20 so as to form a film of a second color. Then, a luminescent layer (G) is vapor deposited in the vapor deposition room 22, while an electron transporting layer (G) is vapor deposited in the vapor deposition room 23. Subsequently, the substrate is moved into the inspection room 25 so as to measure a laminated thickness. After that, the film formation of a color correction layer is adjusted by simulating a luminescence characteristic based on a measurement result. Then, the substrate is again moved into the vapor deposition room 23 or other vapor deposition room (not shown), thereby forming a color correction layer consisting of an electron transporting layer in accordance with an adjusted film thickness.

Finally, after upper electrodes are vapor deposited in the vapor deposition room 24, the substrate is transported into the sealing apparatus 30 by way of the delivery room 43. In the sealing apparatus 30, the substrate is at first moved into the inspection room 33 so as to measure a luminescence characteristic and to confirm that there is no color deviation. Then, the substrate on which an organic layer and upper electrodes have been formed and a sealing cover moved from the sealing cover conveyance room 32 are all moved into the sealing room 34, so that the two members are bonded together by means of an adhesive agent. In this way, an organic EL panel device is formed and discharged out of the manufacturing system by way of the discharge room 44.

Although the above-descried example shows that the inspection steps in the film formation apparatuses 10, 20 are performed during the deposition of the electron transporting layer, the present invention should not be limited by this. In fact, it is also possible to move the substrate into the inspection room 15 or 25 for vapor deposition of each layer, obtain an actually measured value of film thickness of each layer, compare the actually measured film thickness with a preset film thickness, so as to feed back a comparison result to the setting of vapor deposition for subsequent lots. At this time, a measurement result obtained in the inspection room 15 or 25 is transmitted by the data transmission means P to each vapor deposition room.

Figure 13:
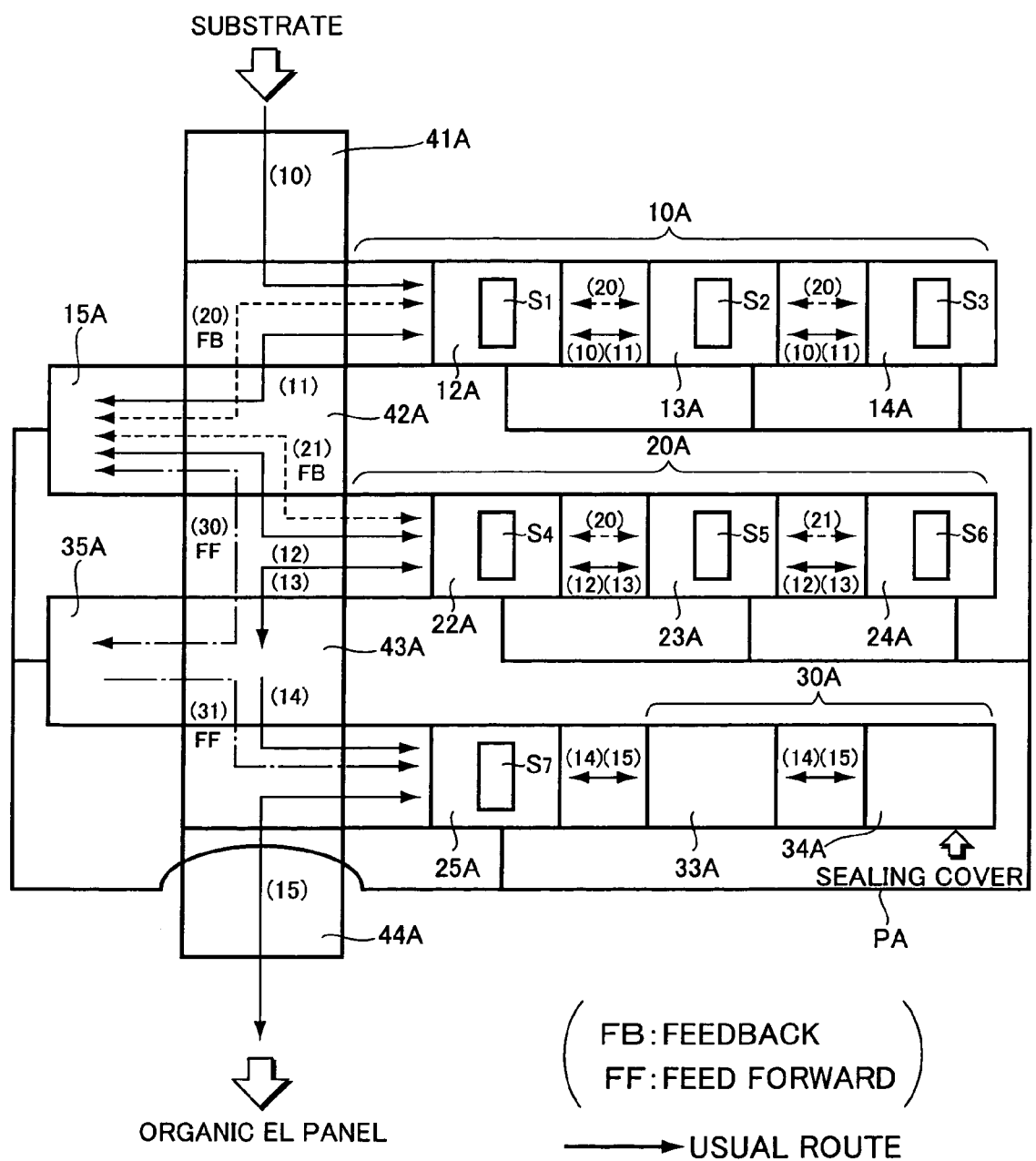
FIG. 13 is an explanatory view showing a system of manufacturing organic EL devices according to one embodiment of the present invention.

In the following, description will be given in detail to explain a manufacturing system shown in FIG. 13. Here, FIG. 13 shows an example of an in-line type manufacturing system for realizing an organic EL device manufacturing method according to another embodiment of the present invention. In fact, such an in-line type manufacturing apparatus performs a continuous operation, and rotates rotary devices such as rollers, thereby moving the substrate by means of these rotary devices and at the same time depositing film formation material on the surface of the substrate. As a result, it is possible to form uniform films on the substrate surface, obtain a high film formation throughput, thus rendering the manufacturing system more favorable than the cluster type manufacturing system shown in FIG. 12.

As shown, this manufacturing system comprises two film formation apparatuses 10A and 20A, as well as a sealing apparatus 30A disposed in parallel with the two film formation apparatuses (only a vapor deposition room 25A is connected with the sealing apparatus 30A), which are all maintained in a vacuum atmosphere (for example, $10^{-4}$ to $10^{-6}$ Pa). The film formation apparatus 10A, located on the substrate inlet side of the system, is connected with a substrate conveyance room 41A, while delivery rooms 42A and 43A are connected between the film formation apparatuses 10A, 20A and the sealing apparatus 30A, with a discharge room 44A connected on the discharge side of the sealing apparatus 30A. Then, an inspection room 15A is provided on one side of the delivery room 42A for measuring the thickness of each formed film, while a preliminary vapor deposition room 35A is provided for forming a color correction layer (an electron transporting layer) and located on one side of the delivery room 43A.

The film formation apparatus 10A and 20A contain a plurality of continuously arranged vapor deposition rooms 12A, 13A, 14A, 22A, 23A, and 24A, including film formation sources S1–S6 linearly arranged for uniformly depositing film formation materials on the substrate surface, with each film formation source located in the center of a corresponding vapor deposition room. Similarly, the inspection room 25A having a film formation source S7 in its center is located beside the sealing apparatus 30. Further, the sealing apparatus 30A contains an inspection room 33A and a sealing room 34A which are continuously arranged together, so that substrate can be inserted from one side of the sealing room 34A and receive a bonding treatment there.

Here, in the film formation apparatuses 10A and 20A, the vapor deposition rooms 12A, 13A, 14A, 22A, 23A, and 24A are provided for forming various organic layers (including a positive hole transporting layer, luminescent layers (R, G, B), an electronic transporting layer), while the vapor deposition room 25A is provided for forming upper electrodes. Further, the respective vapor deposition rooms contain resistance-heating type vacuum vapor deposition devices having vapor deposition sources for heating the deposition materials for forming various layers and thus evaporating the same. Moreover, the inspection room 15A is connected with the vapor deposition rooms 12A, 13A, 14A, 22A, 23A, 24A, and 25A as well as the preliminary vapor deposition room 35A by data transmission means (including a transmission line and a transmission/reception apparatus) PA, in a manner such that it is possible to adjust the film formation thickness in the vapor deposition rooms in accordance with the inspection result obtained in the inspection room 15A.

In using the above-described manufacturing system, a substrate (ITO substrate) treated in the pre-treating step and washed thereafter is moved into the substrate inlet room 41, and disposed on a wire (not shown) operatively associated with a rotating device (not shown) of the film formation apparatus 10A. By virtue of the operation of the rotating device, vapor depositions in the vapor deposition rooms 12A, 13A, and 14A are carried out. Subsequently, by virtue of an adverse operation of the rotating device, the treated substrate is moved into the inspection room 15A so as to measure the thickness of layers laminated on the substrate (refer to solid lines (10), (11) in FIG. 13).

Next, the treated substrate is moved into the film formation apparatus 20A by way of the delivery room 42A, and disposed on a wire (not shown) operatively associated with a rotating device (not shown) of the film formation apparatus 20A. In this way, by virtue of the operation of the rotating device, vapor depositions in the vapor deposition rooms 22A, 23A, and 24A are carried out. Subsequently, by virtue of an adverse operation of the rotating device, the treated substrate is moved into the inspection room 15A so as to measure the thickness of layers laminated on the substrate (refer to solid line (12) in FIG. 13). On the other hand, if the inspection is not required, the substrate can be moved directly into the delivery room 43A after being treated in the vapor depositions performed in the vapor deposition rooms 22A, 23A, and 24A (refer to solid line (13) in FIG. 13).

The substrate moved into the vapor deposition room 25A through the delivery room 43A is further treated so as to form upper electrodes thereon, and then moved into the sealing apparatus 30A so as to examine the luminescence characteristic in the inspection room 33A. Subsequently, in the sealing room 34A, a sealing cover inserted through one side of the sealing apparatus 30A is bonded to the substrate by means of an adhesive agent, thereby forming an organic EL panel which is then discharged through the discharge room 44A (refer to solid lines (14), (15) in FIG. 13).

Next, description will be given to explain in detail an example of a film formation step carried out in the above-described manufacturing system. In fact, most substrates are treated by passing through a route shown by the solid lines (10)–(15) which are called "usual route" covering film formation step and sealing step.

For example, an ITO substrate on which a base layer (a flattening layer or an insulating layer) and lower electrodes have been formed in a pre-treating step is moved into the substrate conveyance room 41A, and then subjected to film formation treatment in the film formation apparatus 10A. In this way, a positive hole injection layer, a positive hole transporting layer, and a luminescent layer (B) are formed by virtue of the film formation sources S1–S3 in the vapor deposition rooms 12A, 13A, and 14A of the film formation apparatus 10A.

Subsequently, the substrate is moved into the inspection room 15A so as to measure the thickness of the laminated layers formed on the lower electrodes. If the measured film thickness is acceptable, the substrate is then moved into the film formation apparatus 20A through the delivery room 42A, so that a luminescent layer (G), a luminescent layer (R), and an electron transporting layer are formed by virtue of the film formation sources S4–S6 in the vapor deposition rooms 22A, 23A, and 24A of the film formation apparatus 20A.

Afterwards, the substrate is moved into the vapor deposition room 25A through the delivery room 43A so as to form upper electrodes thereon by virtue of the film formation source S7. Subsequently, the substrate is moved into the inspection room 33A to examine the luminescence characteristic. Then, a sealing cover inserted through one side of the sealing apparatus 34A is bonded to the substrate so as to seal up the laminated layers on the substrate. Finally, the substrate is discharged out of the system through the discharge room 44A.

In this way, a substrate having passed through the pre-treating step S1 is passed through a usual route represented by solid lines (10)–(15), so that an inspection step is performed at least once before forming the upper electrodes in a film formation step. On the other hand, although the above-described usual route represents an example in which an inspection step is carried out after the formation of the luminescent layer (B) in the vapor deposition room 14A, the present invention should not be limited by this. Actually, it is also possible to perform such an inspection step several times (for example, an inspection step may be performed after each film formation).

Next, FIG. 13 is used to explain a film thickness adjustment based on a feedback FB. However, repeated description will be omitted so as not to explain the contents which are the same as the above-described usual route. Here, according to a usual route, a substrate on which a positive hole injection layer has been formed in the vapor deposition room 12A is moved into the inspection room 15A so as to measure the film thickness of the laminated layers formed on a substrate. Then, if it has been judged that the measured film thickness is not acceptable, the substrate is returned back to the vapor deposition room 12A to form another positive hole injection layer on the previously formed positive hole injection layer (refer to a broken line (20)) so as to form an acceptable film thickness. Similarly, vapor deposition rooms 13A–14A and 22A–24A are so formed that a substrate treated in film formation in the respective vapor deposition rooms is returned back to the inspection room 15A so as to measure the thickness of each film layer to see if the measured thickness is acceptable. If the measured thickness is not acceptable, the substrate is again moved into the same vapor deposition room to perform a further vapor deposition so as to form an acceptable film thickness (refer a broken line (21)). In this way, once an optimum film thickness is formed in each film formation, the substrate is further treated so as to form upper electrodes thereon in the same manner as in the usual route. Subsequently, a sealing step is performed so as to produce an organic EL panel which is then discharged out of the system.

In this way, since inspection step is carried out for each film formation or for specific film formation, it is possible to perform an additional vapor deposition on a previously formed film so as to obtain an acceptable film thickness (feed back FB). Moreover, it is also possible to adjust an amount of vapor deposition from a next lot onwards so as to ensure an acceptable film thickness in vapor deposition.

In the following, FIG. 13 is used to explain a film thickness adjustment based on a feed forward FF. However, repeated description will be omitted so as not to explain the contents which are the same as the above-described usual route. Here, according to a usual route, a substrate on which layers laminated up to an electron transporting layer have been formed (through usual route represented by solid lines (10)–(12)) is moved into the inspection room 15A so as to measure a total film thickness of the laminated layers formed on the substrate. If it is judged that the measured film thickness is thinner than an optimal film thickness, the substrate is moved into the preliminary inspection room 15A through the delivery room 43A. In the preliminary inspection room 35A, an electron transporting layer having a thickness corresponding to an insufficient film thickness is vapor deposited, thereby obtaining an optimal film thickness and thus realizing an adequate thickness correction (refer to a broken line (30)).

Subsequently, the substrate is moved into the vapor deposition room 25A through the delivery room 43A to form upper electrodes thereon, and further moved to the sealing step (refer to a broken line (31)) to complete a predetermined sealing, followed by being discharged out of the system through the usual route (15).

In this way, prior to forming upper electrodes in the film formation step, an inspection step is performed in the inspection room 15A, followed by forming an electron transporting layer serving as a color correction layer in the preliminary vapor deposition room 35A (feed forward FF).

However, the aforementioned inspection steps should not be limited to the above-described embodiments. Actually, it is also possible for a substrate to be moved into the inspection room 15A (if necessary, it is also possible to provide a plurality of inspection rooms) for the vapor deposition of each film layer, obtain an actually measured film thickness for each layer, compare an actually measured value with a preset film thickness, thereby making it possible to perform feed-back FB or feed-forward FF when setting film thickness for vapor deposition in subsequent lots. At this time, a measurement result obtained in the inspection room 15A is transmitted to each vapor deposition room by the data transmission means PA.

In the above, although the cluster type manufacturing system (FIG. 12) and the in-line type manufacturing system (FIG. 13) have been described as organic EL device manufacturing system, the present invention should not be limited by this. In fact, it is also possible to form a combined type manufacturing system by combining the cluster type manufacturing system with the in-line type manufacturing system. In more detail, the sealing apparatus 30A of the in-line type manufacturing system shown in FIG. 13 may be connected through the delivery room 43 to the film formation apparatuses 10, 20 of the cluster type manufacturing system shown in FIG. 12. In case of such a combined type manufacturing system, the sealing apparatus should not be limited to an in-line type. In fact, how to arrange a cluster type and an in-line type can be properly decided by various conditions such as the thickness of film formation and place for installing these apparatus.

In the following, description will be given in detail to explain sealing steps carried out in the sealing apparatus 30 and 30A.

When carrying out an airtight sealing using a sealing cover, spacers (preferably, made of glass or plastic) having a particle size of 1–300 μm are mixed at an appropriate ratio (0.1–0.5 weight %) into an amount of ultraviolet-setting epoxy resin so as to form an adhesive agent which is then applied to an adhesive agent-coating area (corresponding to side walls of the sealing cover) on an organic EL panel substrate, utilizing a dispenser or the like. Further, the interior of the sealing room 34 is kept at an atmosphere of an inert gas such as argon gas, so that the sealing cover is bonded to the substrate through the adhesive agent, followed by irradiating (from the organic EL panel substrate side or the sealing cover side) the adhesive agent with an ultraviolet light so as to harden the same. In this way, it is possible to cover organic EL devices with an inert gas such as argon gas contained within an internal space formed between the sealing cover and the organic EL panel substrate.

Moreover, when carrying out the aforementioned filling and sealing using the sealing cover, a thermosetting resin, a photo-curing resin, an elastomer or the like is applied to the sealing cover using a dispenser or the like. Alternatively, the thermosetting resin, the photo-curing resin, an elastomer, or the like is laminated on the sealing cover. Then, the sealing cover is bonded to an organic EL panel substrate by means of heating under a vacuum condition, followed by performing a hardening treatment thereon. In this way, a sealing space formed between the sealing cover and the organic EL panel substrate is filled with a sealing member consisting of a sheet-like resin material, thereby sealing up the organic EL devices. At this time, the resin applying or the sheet-like resin laminating may be carried out not only on the sealing cover, but also on the organic EL panel substrate.

On the other hand, when the sealing is carried out using a sealing film, the spin coating method can be used to apply an organic material such as photo-curing resin as a buffer layer to the organic EL panel substrate on which upper electrodes have been formed after an inspection step, followed by performing an irradiation with ultraviolet rays so as to effect a hardening treatment. Subsequently, another buffer layer is formed by sputtering an inorganic material such as $SiO_2$. Then, one buffer layer consisting of photo-curing resin and another buffer layer consisting of $SiO_2$ are alternatively laminated so as to realize the desired sealing. At this time, the sealing film can be formed by laminating a single layer of protection film or a plurality of protection films, and is allowed to be formed by either an inorganic material or an organic material. Here, an inorganic material may be a nitride such as SiN, AlN, and GaN, or an oxide such as SiO, $Al_2O_3$, $Ta_2O_5$, ZnO, and GeO, or an oxidized nitride such as SiON, or a carbonized nitride such as SiCN, or a metal fluorine compound, or a metal film, etc. On the other hand, an organic material may be an epoxy resin, or an acryl resin, or a paraxylene resin, or a fluorine system high molecule such as perfluoro olefin and perfluoro ether, or a metal alkoxide such as $CH_3OM$ and $C_2H_5OM$, or a polyimide precursor, or a perylene system compound, etc. In practice, the above-mentioned lamination and material selection can be carried out by appropriately designing the organic EL devices.

The film formation step according to the embodiments of the present invention-should not be limited to the above-described vapor deposition. In fact, apart from the aforementioned applying step such as spin coating, dipping or the like, it is also possible to use a wet step such as screen printing, ink jet printing and the like, provided that it is a film formation method capable of performing a film thickness adjustment.

Next, description will be given in detail to explain organic layers formed according to the above-described embodiments of the present invention. Usually, an organic layer is a combination including a positive hole transporting layer, a luminescent layer, and an electron transporting layer. Actually, each of the positive hole transporting layer, the luminescent layer, and the electron transporting layer may include either only one layer or a plurality of layers. Further, the positive hole transporting layer and/or the electron transporting layer may be omitted. Moreover, if necessary, it is also possible to insert an organic layer such as a carrier block layer, in addition to a hole injection layer and an electron injection layer. In practice, the above design can be properly changed by appropriately increasing or decreasing the vapor deposition rooms.

Besides, the above-described film layers can be formed by using conventional materials (regardless of whether it is a high molecular material or a low molecular material). With regard to a luminescent material, it is allowed to use a material capable of producing a luminescence (fluorescence) when the material returns from a singlet excited state to a base state, or a material capable of producing a luminescence (phosphorescence) when it returns from a triplet excited state to a base state.

The above-described embodiments of the present invention do not form any limitation to the configuration of organic EL panel. For example, an organic EL panel may be a bottom emission type which produces light from its substrate side, or a top emission type which produces light from a side opposite to its substrate. On the other hand, panel driving may be either an active driving or a passive driving. In the bottom emission type an organic layer is corrected, while in the top emission type a color correction layer for correcting transparent upper electrodes is formed on organic layer.

According to the above-described embodiments or examples of the present invention, the method of manufacturing organic EL devices carries out an inspection step after a pre-treating step but before the formation of upper electrodes in a film formation step, measures the thickness of lower electrodes and organic layer, performs a simulant calculation from the measurement result, corrects film thickness through subsequent film formations, thereby producing organic EL devices free from any color deviation. As a result, it is possible to judge a color deviation caused due to a film formation failure, thereby producing acceptable organic EL devices free from any color deviation. Besides, since it is possible to eliminate any process loss which often occurs in prior art, it is allowed to improve product yield.

In the method of and system for manufacturing organic EL devices according to the present invention, since the thickness of lower electrodes is directly measured after a pre-treating step, or since the thickness of an organic layer is directly measured during a film formation step, it is possible to enable the thickness of a finally formed organic layer to be coincident with a preset value of film thickness even if the film formation is not performed with a high precision, thereby making it possible to obtain organic EL devices free from any color deviation.

Further, by directly measuring the thickness of lower electrodes and organic layer using an optical film thickness measurement method, it is possible to find not only a film thickness, but also an index of refraction and a light absorption characteristic. In this way, since it is possible to predict a color deviation through a simulant calculation taking into account the above facts, it is possible to effectively eliminate any color deviation by forming a color correction layer after an inspection step.

Moreover, since actual measurement data of each film layer can be fed back when setting the film thickness of each film layer for a next lot, it is possible to prevent a similar film formation failure in a subsequent lot even if a previous lot has produced a film formation failure.

Furthermore, since an inspection room for performing a film thickness measurement is connected with a vapor deposition room through data transmission means, the measurement result can be fed back or forward in setting a film thickness to be obtained in the vapor deposition room, thereby making it possible to perform an automation in setting a film thickness.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A method of manufacturing organic EL devices, comprising:
    a pre-treating step for forming at least lower electrodes on a substrate;
    a film formation step for forming an organic layer containing at least an organic luminescent layer and upper electrodes on the lower electrodes subsequent to the pre-treating step;
    a sealing step for sealing up the organic layer and the upper electrodes subsequent to the film formation step,
    wherein an inspection step is carried out subsequent to the pre-treating step, prior to the formation of the upper electrodes, and during the film formation step in which the organic layer is formed.

2. The method according to claim 1, wherein the inspection step measures the thickness of the lower electrodes.

3. The method according to claim 1, wherein the inspection step is carried out prior to the formation of the organic layer, and the thickness of the organic layer is adjusted in accordance with the result of the inspection step.

4. The method according to claim 1, wherein the inspection step measures the thickness of the organic layer.

5. The method according to claim 1, wherein the inspection step is carried out after forming at least one first organic layer in the film formation step, and the thickness of the organic layer laminated on the first organic layer is adjusted in accordance with the result of the inspection step.

6. The method according to claim 1, wherein the inspection step is carried out after forming at least one first organic layer in the film formation step, and the thickness of the first organic layer is adjusted in accordance with the result of the inspection step.

7. The method according to claim 1, wherein the inspection step includes a first inspection step to be performed before the formation of the organic layer and a second inspection step to be performed during the film formation step in which the organic layer is formed.

8. The method according to claim 7, wherein the first inspection step measures the thickness of the lower electrodes, the second inspection step measures the thickness of the organic layer, and thickness of the organic layer is adjusted in accordance with the results of the first and second inspection steps.

9. The method according to claim 3, wherein luminescent colors are adjusted by adjusting various film thicknesses.

10. The method according to claim 1, wherein the inspection step is carried out by using an optical film thickness measuring method.

11. The method according to claim 4, wherein the inspection step is carried out after forming at least one first organic layer in the film formation step, and the thickness of the organic layer laminated on the first organic layer is adjusted in accordance with the result of the inspection step.

12. The method according to claim 4, wherein the inspection step is carried out after forming at least one first organic layer in the film formation step, and the thickness of the first organic layer is adjusted in accordance with the result of the inspection step.

13. The method according to claim 5, wherein luminescent colors are adjusted by adjusting various film thicknesses.

14. The method according to claim 6, wherein luminescent colors are adjusted by adjusting various film thicknesses.

15. The method according to claim 8, wherein luminescent colors are adjusted by adjusting various film thicknesses.

16. A method of manufacturing organic EL devices, comprising:
    a pre-treating step for forming at least lower electrodes on a substrate;

a film formation step for forming an organic layer containing at least an organic luminescent layer and upper electrodes on the lower electrodes subsequent to the pre-treating step;

a sealing step for sealing up the organic layer and the upper electrodes subsequent to the film formation step, wherein an inspection step is carried out subsequent to the pre-treating step but prior to the formation of the upper electrodes, and a stimulant calculation is performed to calculate a luminescent characteristic of the organic layer in accordance with the result of the inspection step, followed by adjusting the thickness of the organic layer in accordance with the result of the stimulant calculation.

17. The method according to claim 16, wherein the inspection step includes a first inspection step to be performed before the formation of the organic layer and a second inspection step to be performed during the film formation step in which the organic layer is formed.

18. The method according to claim 16, wherein luminescent colors are adjusted by adjusting various film thicknesses.

19. The method according to claim 16, wherein the inspection step is carried out by using an optical film thickness measuring method.

* * * * *